US012747156B2

(12) United States Patent
Schuler et al.

(10) Patent No.: US 12,747,156 B2
(45) Date of Patent: Sep. 29, 2026

(54) METHOD FOR PRODUCING A MICROMECHANICAL DEVICE COMPRISING A CAVITY HAVING A MELT SEAL

(71) Applicant: Robert Bosch GmbH, Stuttgart (DE)

(72) Inventors: Raphael Schuler, Tuebingen (DE); Volker Schmitz, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 353 days.

(21) Appl. No.: 18/423,008

(22) Filed: Jan. 25, 2024

(65) Prior Publication Data

US 2024/0262682 A1 Aug. 8, 2024

(30) Foreign Application Priority Data

Feb. 8, 2023 (DE) ..................... 10 2023 201 034.8

(51) Int. Cl.
*B81C 1/00* (2006.01)

(52) U.S. Cl.
CPC .. *B81C 1/00285* (2013.01); *B81C 2201/0125* (2013.01); *B81C 2201/0132* (2013.01); *B81C 2201/0198* (2013.01); *B81C 2203/0118* (2013.01); *B81C 2203/0172* (2013.01)

(58) Field of Classification Search
CPC ........ B81C 1/00285; B81C 2201/0125; B81C 2201/0132; B81C 2201/0198; B81C 2203/0118; B81C 2203/0172; B81C 2203/0145; B81C 1/00293; B81C 1/00047; B81C 1/00436; B81C 1/00523; B81B 7/02

See application file for complete search history.

(56) References Cited

U.S. PATENT DOCUMENTS 10,118,392 B2 * 11/2018 Friesen .................. B41J 2/1603

FOREIGN PATENT DOCUMENTS

| | | | |
|---|---|---|---|
| DE | 102006016260 | A1 | 10/2007 |
| DE | 102014202801 | A1 | 8/2015 |
| DE | 102019218926 | A1 | 6/2021 |
| JP | 2009006453 | A | 1/2009 |

* cited by examiner

*Primary Examiner* — Cuong B Nguyen

(74) *Attorney, Agent, or Firm* — Norton Rose Fulbright US LLP

(57) ABSTRACT

A method for producing a micromechanical device. The method includes: providing a MEMS substrate having micromechanical functional layers bounding a cavity; structuring an oxide layer to form an oxide mask having at least one first recess having a first diameter; applying a resist mask to the oxide mask and the first recess; introducing a second recess into the resist mask in the area of the first recess, the second diameter being smaller than the first diameter; introducing a first trench into the MEMS substrate through the second recess; removing the resist mask; introducing a second trench into the MEMS substrate through the first recess and simultaneously deepening the first trench at least through the micromechanical substrate; adjusting a desired gas composition at a desired pressure in the cavity; sealing the first trench using a melt plug by melting substrate material of the MEMS substrate that surrounds the first trench.

4 Claims, 7 Drawing Sheets

METHOD FOR PRODUCING A MICROMECHANICAL DEVICE COMPRISING A CAVITY HAVING A MELT SEAL

CROSS REFERENCE

The present application claims the benefit under 35 U.S.C. § 119 of German Patent Application No. DE 10 2023 201 034.8 filed on Feb. 8, 2023, which is expressly incorporated herein by reference in its entirety.

BACKGROUND INFORMATION

The present invention relates to a method for producing a micromechanical device comprising a cavity having a melt seal.

Microelectromechanical systems (MEMS) are often manufactured in surface micromechanics and have micromechanical functional layers on a MEMS substrate. The micromechanical functional layers are protected from environmental influences by being arranged in a cavity. Such cavities are created, for example, by bonding a cap to the MEMS substrate.

As a result of the miniaturization of components, more and more MEMS devices, in particular sensors having different requirements for the internal cavity pressure and thus arranged in a plurality of cavities, are integrated on the same chip.

German Patent Application No. DE 10 2006 016 260 A1 describes a micromechanical device and a production method that, by using a getter in one of two cavities on the same chip, sets the optimal working conditions for an acceleration sensor (relatively high internal cavity pressure) and for a rotation rate sensor (low internal cavity pressure due to the getter present in the cavity).

German Patent Application No. DE 10 2014 202 801 A1 describes a method for producing a micromechanical device having a plurality of cavities that also combine different internal cavity pressures for different sensor cores, namely an acceleration sensor and a rotation rate sensor, on one silicon chip. The different internal pressures are implemented by subsequently opening and resealing at the required cavity pressure by means of laser reseal technology. With laser reseal technology, after the process of bonding the MEMS substrate and cap, a cavity having a small trench structure is additionally opened. Annealing is carried out in a further step and, subsequently, the target internal pressure is adjusted and the trench structure is sealed by melting the silicon surface by means of a laser (laser reseal) in said process step. In this case, the opened cavity is hermetically sealed again.

In current new product developments, an IC substrate, an ASIC, is used as the cap. In doing so, the sensor wafer is eutectically bonded to a cap, and the cap simultaneously contains an integrated circuit, an ASIC for operating the MEMS. By means of said so-called ASICap technology, a plurality of micromechanical devices is also to be integrated on a common MEMS substrate, wherein the two different sensors have to be operated at different internal cavity pressures. To this end, the laser resealing process is also to be used in ASICap technology. The two cavities for the acceleration and rotation rate sensor must be hermetically sealed.

However, the application of laser reseal technology by means of the ASICap wafer has some disadvantages. In the area of the laser resealing by means of the ASICap wafer, all ASIC oxides and metals must be pre-structured. In addition, no ASIC circuit may be present in the area of the laser resealing. Especially the oxide height to be opened in the area of the resealing on the ASICap wafer leads to high polymer particle loading in the edge area and on the rear side of the wafer during processing. Further processing in series production is thus not possible or only possible with significant cleaning effort.

An object of the present invention is to provide a simplified method for opening and resealing a micromechanical cavity.

SUMMARY

The present invention provides access to the cavity by means of two-stage trench etching through the MEMS substrate, adjusting the desired gas composition at the desired pressure in the cavity, and then sealing the access by means of a melt seal created by laser melting the surrounding substrate material.

Advantageously, the seal technology does not affect the cap so that greater design freedoms exist for the production of the cap. Particularly advantageously, an IC chip, an ASIC, can be used as a cap without compromising integrated electronic circuits or limiting the same to particular areas. According to the present invention, the two-stage trench etching creates an access having a melt seal recessed in a recess with respect to the rear side of the MEMS substrate. Advantageously, the rear side can be planarized, thinned and mounted on other surfaces without compromising the melt seal.

An advantage of the present invention lies in the suitability thereof for series production, simplified process management, reduced process costs, and the possibility to use as ASIC circuit area the surface area previously kept free in the ASIC area for the laser resealing. This also means cost savings. In principle, the technology described herein may also be employed in other configurations of MEMS and cap without ASIC.

Advantageously, highly integrated micromechanical sensors can be created by means of the present invention, wherein a plurality of sensors is arranged on a common MEMS substrate in a plurality of cavities having different gas compositions and pressures. For this purpose, the method according to the present invention, in particular the steps for adjusting the atmosphere and sealing by laser melting, can be used simultaneously or sequentially on different cavities.

DETAILED DESCRIPTION OF EXAMPLE EMBODIMENTS

Figure 1:
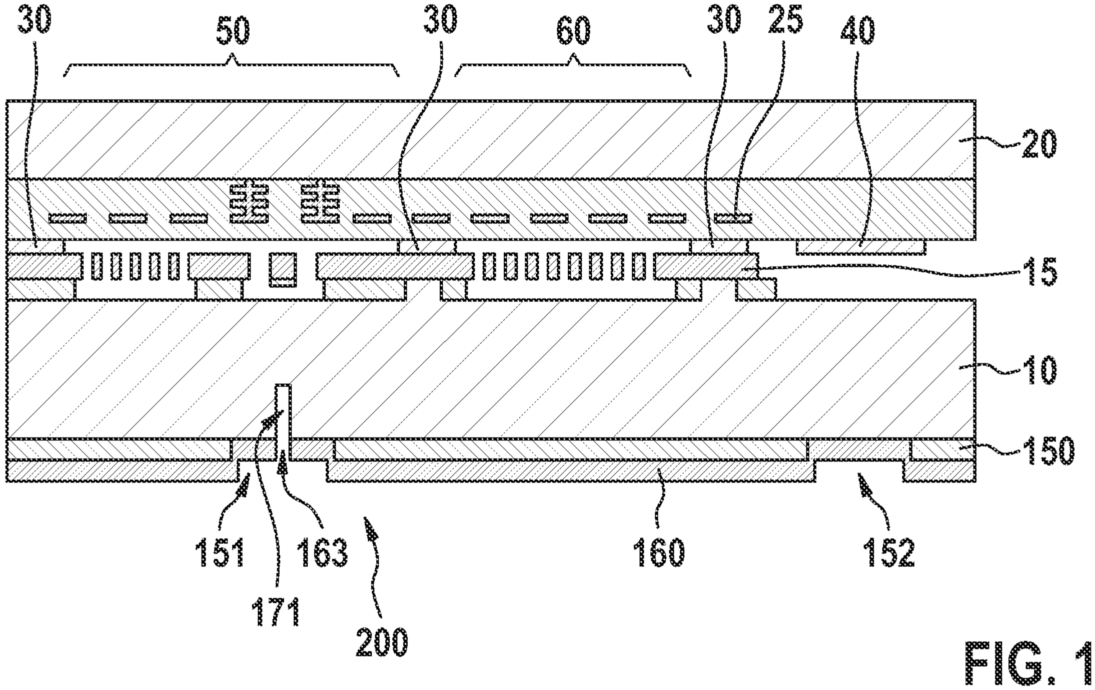
FIG. 1 shows a first precursor of the device according to an example embodiment of the present invention being produced and having a first etched trench in the form of a blind hole.

FIG. 1 shows a first precursor of the device according to the present invention being produced. Shown are a micromechanical substrate 10 and an ASIC substrate 20, which are connected to each other by means of a bond frame 30. The bond frame thereby bounds two hermetically sealed cavities 50, 60. On a front side of the MEMS substrate, in the cavities, micromechanical structures are formed in a micromechanical functional layer 15. In the present example, the structure of a rotation rate sensor is arranged in the first cavity 50 and the structure of an acceleration sensor is arranged in the second cavity. An IC structure 25 is arranged on a front side of the ASIC substrate, bounding the cavities. Furthermore, a bond pad 40 is arranged on the inner side of the ASIC substrate but outside the cavities. An oxide layer is arranged on a rear side of the MEMS substrate and is structured to form an oxide mask 150 comprising a first recess 151 of approximately 100-200 μm diameter in an access area 200. In the present exemplary embodiment, the oxide mask additionally comprises a second recess 152. A resist mask 160 having a third recess 163 of approximately 10 μm diameter in the area of the first recess 151 is arranged on the oxide mask, the first recess, and the second recess. Through the third recess, a narrow first etched trench 171 of approximately 10 μm diameter is introduced into the MEMS substrate from the rear side. The first etched trench does not yet extend to the front side of the MEMS substrate but is a blind hole having a depth of 100-300 μm.

Figure 2:
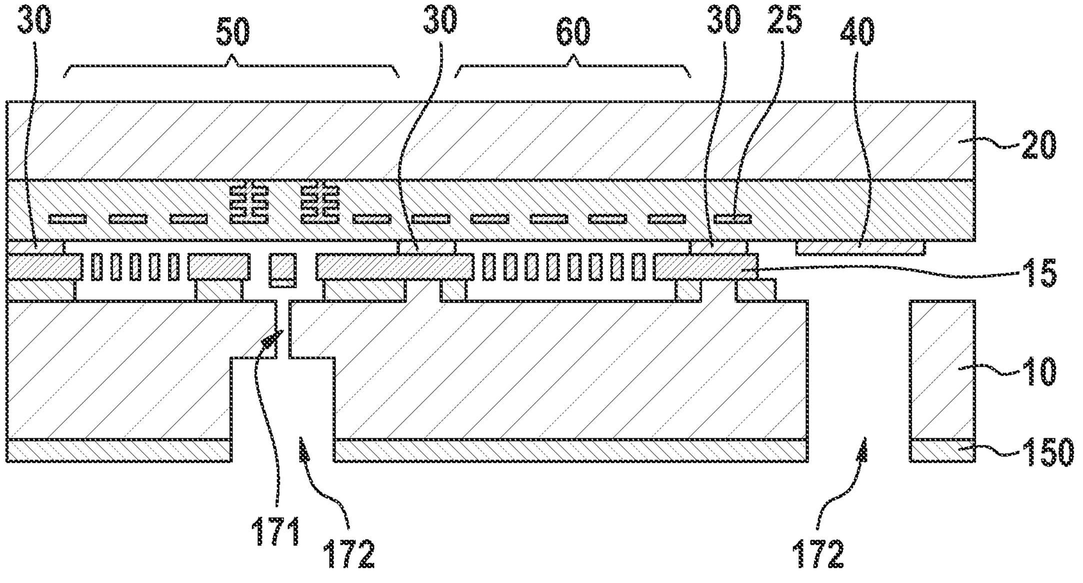
FIG. 2 shows a second precursor of the device according to an example embodiment of the present invention being produced and having an access through a first and a second etched trench.

FIG. 2 shows a second precursor of the device according to the present invention being produced.

The resist mask is removed and wide second etched trenches 172 of approximately 100-200 μm diameter are introduced into the MEMS substrate 10 through the first recess 151 and the second recess 152 in the oxide mask 150. The first etched trench has also been further recessed and now extends to the front side of the MEMS substrate. The first etched trench thus creates a narrow, resealable access to the first cavity 50. In addition, a second etched trench 172 has also opened access to the bond pad 40.

Figure 3:
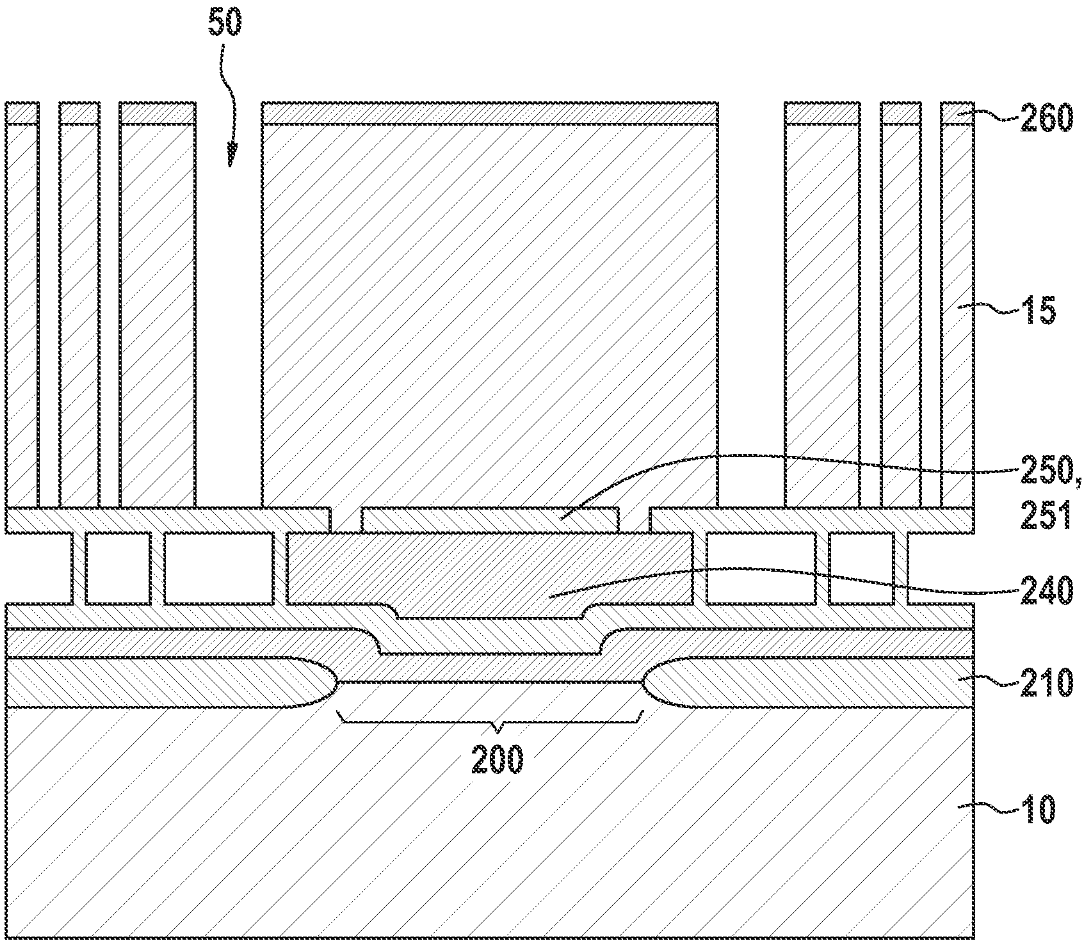
FIG. 3 shows a first precursor of an access area to a cavity of the device according to an example embodiment of the present invention, prior to the exposing of micromechanical structures.

FIG. 3 shows a first precursor of an access area to a cavity of the device according to the present invention, prior to the exposing of micromechanical structures. Shown is a detailed schematic of the substructures below the functional structures 15 of the rotation rate sensor in the first cavity 50 in the access area 200. A lower oxide 210 is arranged on the front side of the micromechanical substrate 10 and is structured in the access area. Further layers are arranged thereon, including a polysilicon layer 240 and an upper oxide layer 250. A portion of the upper oxide layer 250, the oxide structure 251, is enclosed between the subjacent polysilicon layer 240 and the superjacent micromechanical functional layer 15 in order to protect said layer from removal in the process step of gas phase etching, which is to expose the micromechanical structures. In the process sequence, said schematic corresponds to the manufacturing state between structuring the micromechanical functional layer by means of anisotropic etching and gas phase etching. A further oxide mask 260 is arranged on the micromechanical functional layer.

Figure 4:
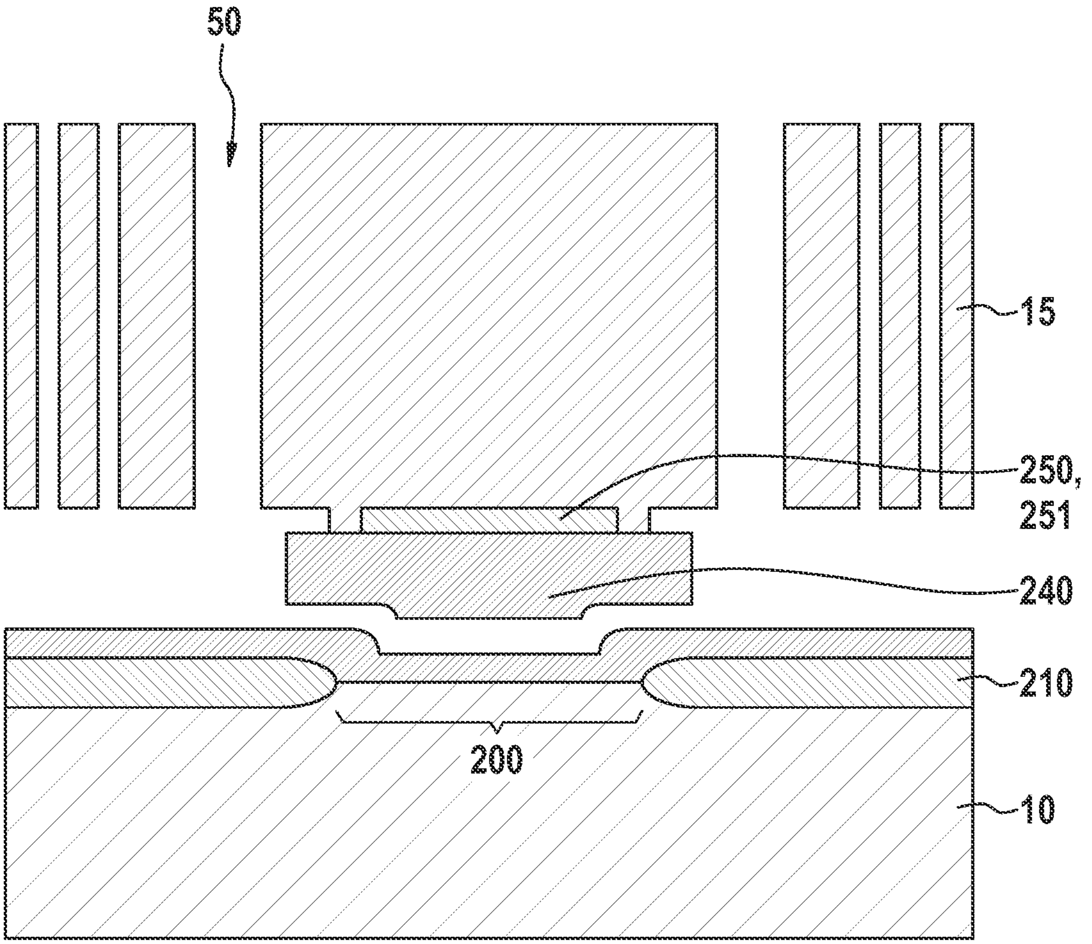
FIG. 4 shows a second precursor of an access area to a cavity of the device according to an example embodiment of the present invention, after the exposing of micromechanical structures.

FIG. 4 shows a second precursor of an access area to a cavity of the device according to the present invention, after the exposing of micromechanical structures. The figure shows a detailed schematic of the substructures below the functional structures 15 of the rotation rate sensor in the first cavity 50 after gas phase etching has occurred. All accessible oxides have been removed. The oxide structure 251 of the upper oxide layer 250 that is enclosed in polysilicon is not accessible to gas phase etching (GPÄ) and is therefore intact. In the access area 200, all oxides are otherwise removed by the standard gas phase etching process (sensor core exposing process). To this end, no additional process needs to be used, but rather layout adaptations create access for the gas phase etching process (see FIGS. 3 and 4).

Figure 5:
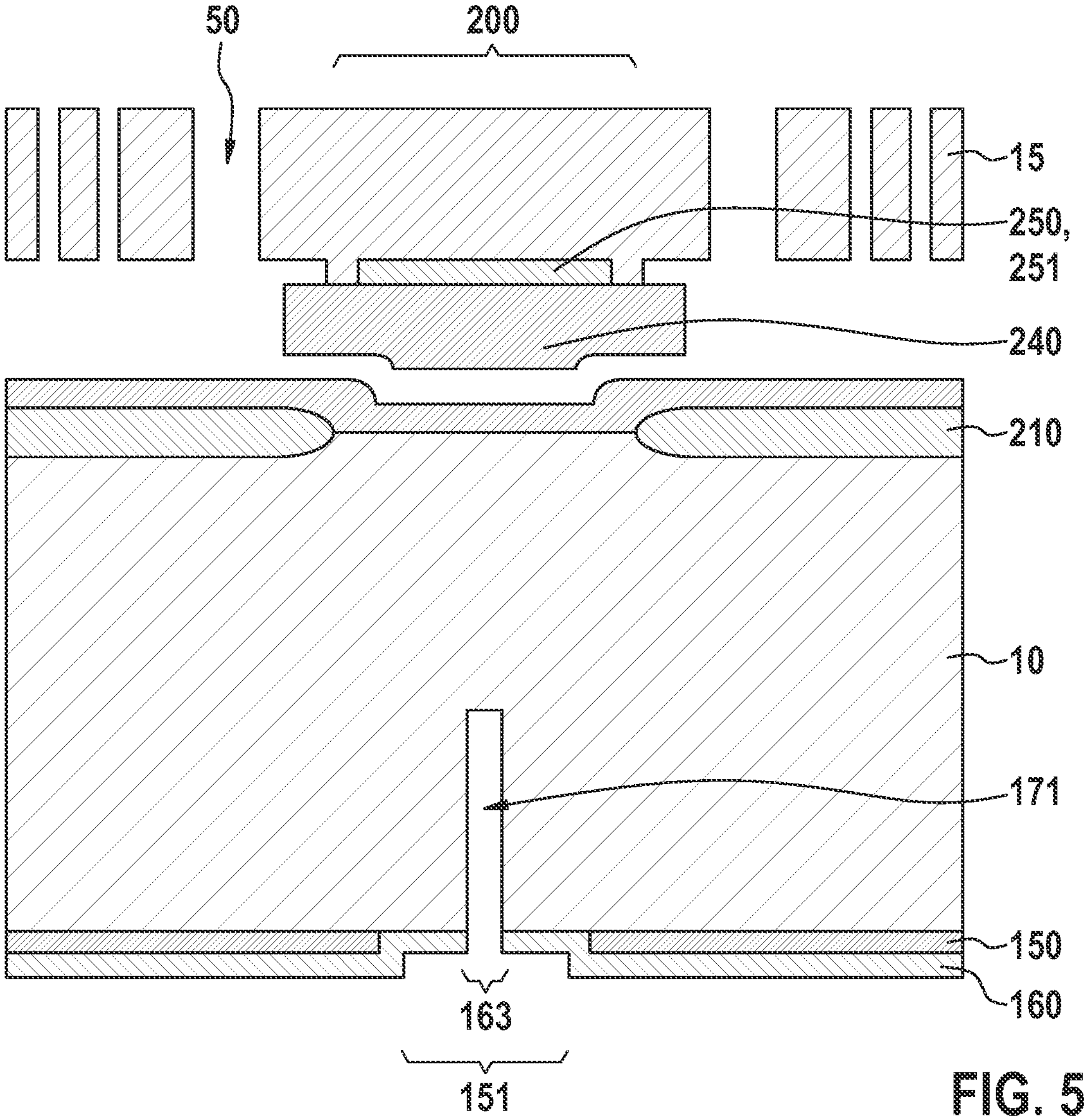
FIG. 5 shows a third precursor of an access area to a cavity of the device according to an example embodiment of the present invention, having a first etched trench in the form of a blind hole.

FIG. 5 shows a third precursor of an access area to a cavity of the device according to the present invention, having a first etched trench in the form of a blind hole. FIG. 5 corresponds to FIG. 1. An oxide mask 150 is arranged on the rear side of the MEMS substrate 10 and comprises the first recess 151 in the access area 200. The resist mask 160 is arranged above the same and also covers the first recess 151 and comprises a narrower third recess 163 therein. Through the third recess, the etched trench 171 is introduced into the MEMS substrate from the rear side. Said first narrow trench is already etched by anisotropic etching but does not yet extend to the necessary depth to ventilate the cavity 50.

Figure 6:
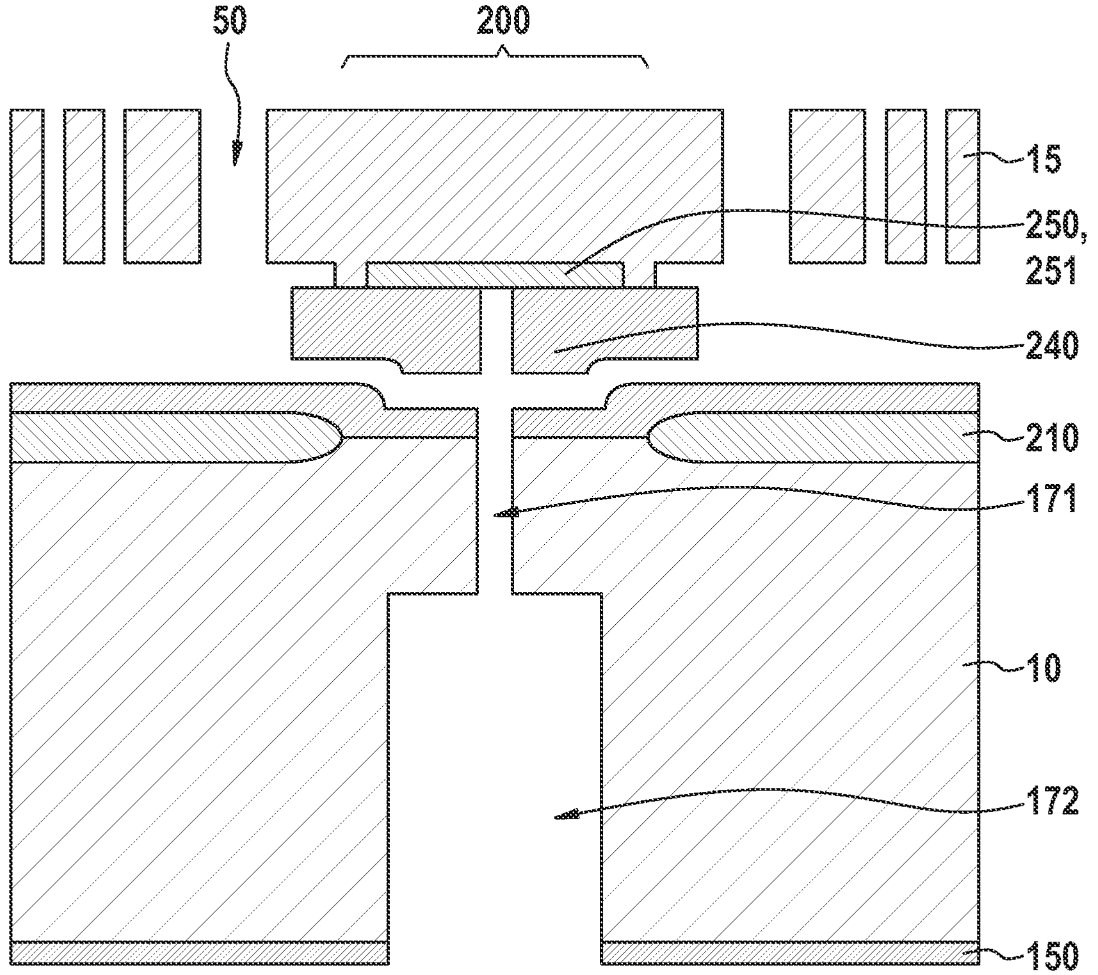
FIG. 6 shows a fourth precursor of an access area to a cavity of the device according to an example embodiment of the present invention, having an access through a first and a second etched trench.

FIG. 6 shows a fourth precursor of an access area to a cavity of the device according to the present invention, having an access through a first and a second etched trench. FIG. 6 corresponds to FIG. 2. After removal of the resist mask 160, a correspondingly wide second etched trench 172 is introduced into the MEMS substrate 10 from the rear side through the first recess 151 of the oxide mask 150. Etching the second trench also further deepens the narrower first trench 171 at a reduced etching rate until breaking through the MEMS substrate 10 and all layers present thereon, thus opening and ventilating the cavity 50. The trench may also pass through the polysilicon layer 240 but stops at the oxide structure 251 already described in FIGS. 3 and 4. The trench therefore cannot be driven further into the cavity 50 or through the functional layer 15 or even into the superjacent cap, in particular the ASIC substrate.

In the next step, the oxide hard mask 150 used for the second trench process is removed. In the subsequent step, the cavity 50 is hermetically sealed at the desired atmospheric internal pressure and the atmospheric composition by means of a laser resealing process.

Figure 7:
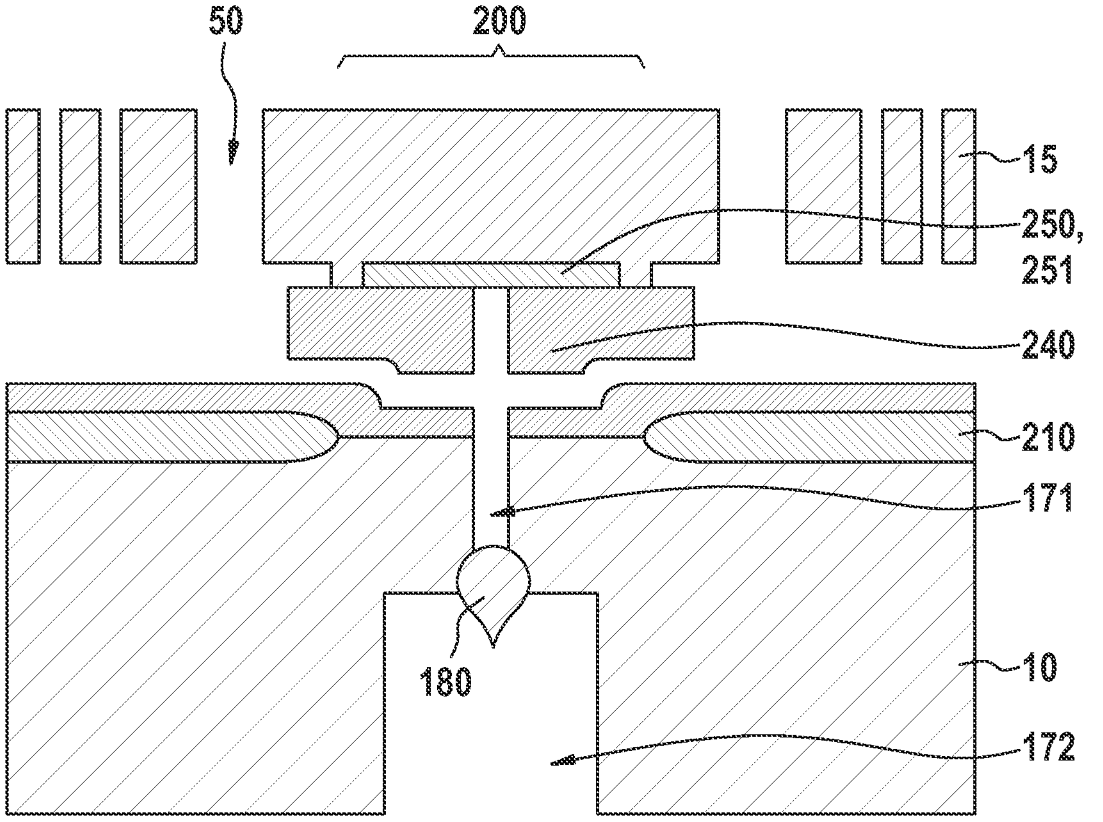
FIG. 7 shows the access area, sealed by means of laser melting, to a cavity of the device according to an example embodiment of the present invention.

FIG. 7 shows the access area, sealed by means of laser melting, to a cavity of the device according to the present invention. The laser resealing process includes annealing, adjusting the target pressure, and sealing the narrow first etched trench 171 having the smaller 10 μm diameter, by melting the surrounding substrate material by means of a laser. The molten substrate material forms a melt plug 180, which, upon solidification, seals the access to the cavity 50. The cavity is now hermetically sealed at the target pressure.

In the packaging process, the MEMS substrate can subsequently be ground down to the desired target thickness of the product if the target thickness has not yet been achieved by means of the first grinding (e.g., 400-600 μm) prior to application of the oxide mask. However, the grinding process must not re-open the melt seal 180. The second trench process for producing the second etched trench 172 must therefore etch said trench more deeply than the remaining planned removal during the grinding process to the target thickness of the product.

In the access area 200 of the MEMS component, a structure may be arranged, in which an oxide structure 251 is embedded in the silicon beneath the epitactic polysilicon 15 (epipoly) and is not removed by gas phase etching. Said oxide serves as the etching stop for the first etched trench 171 (FIG. 6) when etching through the MEMS substrate 10 during the second etching process. Said oxide etching stop also serves as a beam catcher and prevents the unfocused laser from hitting delicate micromechanical structures or the opposing cap in the laser resealing process. This is in particular important if the cap is an ASIC substrate, and, more particularly, if the IC structures are arranged on the inner side of the cap and would be exposed to laser radiation without a beam catcher. The arrangement of the oxide structure 251 as a beam catcher thus makes the recessing of ASIC circuits in said area on the opposite ASIC unnecessary. The surface area provided on the ASIC in current layouts is approximately 70×70 μm and would now, with the beam catcher, be available on the ASIC as an additional surface area.

Figure 8:
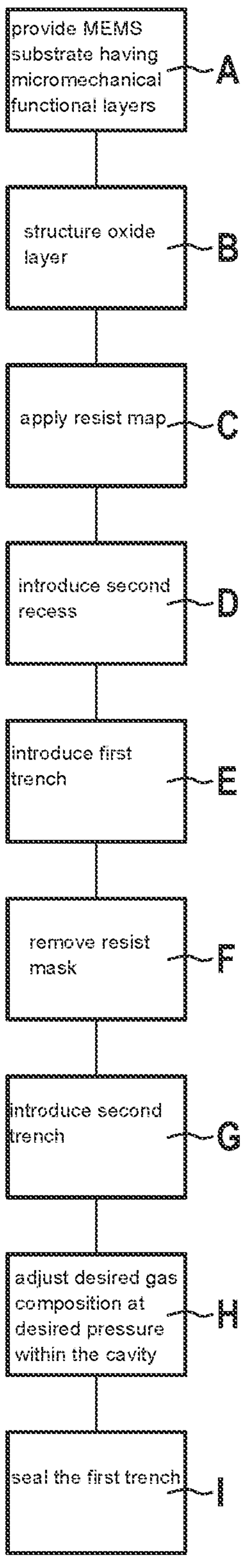
FIG. 8 schematically shows the sequence of the method according to an example embodiment of the present invention for producing a micromechanical device.

FIG. 8 schematically shows the sequence of the method according to the present invention for producing a micromechanical device having a cavity, an access channel to the cavity, and a melt seal in the access channel.

The method has the essential steps of:

(A) providing a MEMS substrate having micromechanical functional layers on an inner side bounding a cavity;

(B) structuring an oxide layer to form an oxide mask having at least one first recess having a first diameter on an outer side of the MEMS substrate;

(C) applying a resist mask to the oxide mask and the first recess;

(D) introducing a second recess having a second cross section into the resist mask in the area of the first recess, wherein the second diameter is smaller than the first diameter;

(E) introducing a first trench into the MEMS substrate through the second recess having the second diameter, to a first depth;

(F) removing the resist mask;

(G) introducing a second trench into the MEMS substrate through the first recess having the first diameter, to a second depth and simultaneously deepening the first trench at least through the micromechanical substrate to the inner side;

(H) adjusting a desired gas composition at a desired pressure in the cavity;

(I) sealing the first trench by means of a melt plug by melting substrate material of the MEMS substrate that surrounds the first trench.

The described method can be used for producing highly integrated micromechanical sensors, for example, wherein a plurality of sensors is arranged on a common MEMS substrate in a plurality of cavities having different gas compositions and pressures. To this end, a MEMS substrate is provided, to which an ASIC is bonded, wherein the MEMS substrate and the ASIC bound a plurality of cavities closed off from each other, and wherein an integrated circuit is arranged on an inner side of the ASIC that is adjacent to the cavities. Various micromechanical structures and various sensor cores are arranged in the cavities. The same gas composition is still present at the same pressure in all of the cavities.

In the area of the laser resealing, i.e., in the access area of a cavity, all oxides in the sensor core are removed by means of the standard gas phase etching process for exposing micromechanical structures. After eutectic bonding of the sensor wafer and the ASICap cap wafer, a grinding process may be used to thin the sensor wafer. This allows further handling of the bonded stack in the manufacturing process. The target thickness of the product is processed in a later step, for example in the packaging process. On the sensor side, after grinding in the area of the laser resealing, the access area for the cavity is prepared by introducing a first narrow trench having a diameter of approximately 10 μm as a blind hole into the MEMS substrate (FIG. 1). This first trench later provides the cavity access, but the sensor cavity is not reached in the present first etching step. In a further trench, the access area is opened further at a significantly larger diameter of 100 μm, for example (FIG. 2). As a result of said second trench, the first trench is continued at a reduced etching rate and the cavity is opened. The first trench thus represents a certain advancing, which is etched further by the second trench. The thickness of the sensor wafer, the etching depth of the first trench, and the etching duration of the second trench must be adapted to each other. The thinner, first trench breaks through the sensor core substrate in the area of the laser resealing and ventilates the cavity. The trench stops at an oxide layer embedded in silicon, said layer not being removed in the preceding gas phase etching (FIG. 3). This prevents the unfocused laser from hitting the active ASIC front side in the later laser resealing process and eliminates the need for a free surface area on the side of the ASIC.

After the cavity has been ventilated by the step trench, the laser resealing process is performed, with annealing, adjusting the gas composition and target pressure in the cavity, and melting the area of the first trench (10 μm diameter) by means of the laser resealing process. The laser resealing process corresponds to the standard resealing process except for the seal depth. The cavity is hermetically sealed. Said process steps may be repeated for further cavities. And further gas compositions that differ from those in other cavities can thus be enclosed at the desired pressure.

In subsequent steps, the sensor wafer can be ground to the target thickness, wherein the trench depth of the second trench must be greater than the thickness of the sensor wafer to be removed later. As a result, the melt seal remains unaffected and intact during grinding.

List of reference signs

10 Micromechanical substrate
15 Micromechanical functional layer, epipoly
20 IC substrate (ASIC)
25 IC structure (integrated circuit)
30 Bond frame
40 Bond pad
50 First cavity
60 Second cavity
150 Oxide mask
151 First recess
152 Second recess
160 Resist mask
163 Third recess
171 First etched trench
172 Second etched trench
180 Melt seal

200 Access area
210 Lower oxide layer
240 Polysilicon layer
250 Upper oxide layer
251 Oxide structure
260 Further oxide mask

What is claimed is:

1. A method for producing a micromechanical device having a cavity, an access channel to the cavity, and a melt seal in the access channel, the method comprising steps including:

(A) providing a microelectromechanical systems (MEMS) substrate having micromechanical functional layers on an inner side bounding the cavity;

(B) structuring an oxide layer to form an oxide mask having a first recess having a first diameter on an outer side of the MEMS substrate;

(C) applying a resist mask to the oxide mask and the first recess;

(D) introducing a second recess having a second diameter into the resist mask in an area of the first recess, wherein the second diameter is smaller than the first diameter;

(E) introducing a first trench into the MEMS substrate through the second recess having the second diameter, to a first depth;

(F) removing the resist mask;

(G) introducing a second trench into the MEMS substrate through the first recess having the first diameter, to a second depth and simultaneously deepening the first trench at least through the micromechanical substrate to the inner side;

(H) adjusting a desired gas composition at a desired pressure in the cavity; and (I) sealing the first trench using a melt plug by melting substrate material of the MEMS substrate that surrounds the first trench.

2. The method according to claim 1, wherein, in step (G), the first trench is deepened until an oxide structure is exposed.

3. The method according to claim 1, wherein, in step (A), the MEMS substrate is provided, to which an IC integrated circuit (IC) substrate is bonded, wherein the MEMS substrate and the IC substrate bound the cavity, and wherein an integrated circuit is arranged on an inner side of the IC substrate that is adjacent to the cavity.

4. The method according to claim 1, wherein, after step (I), in a step (J), the MEMS substrate is thinned on a rear side.

* * * * *